(12) United States Patent
Sakashita

(10) Patent No.: US 6,891,714 B2
(45) Date of Patent: May 10, 2005

(54) MULTI-LAYERED UNIT INCLUDING ELECTRODE AND DIELECTRIC LAYER

(75) Inventor: Yukio Sakashita, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/375,919

(22) Filed: Feb. 26, 2003

(65) Prior Publication Data

US 2004/0166357 A1 Aug. 26, 2004

(51) Int. Cl.$^7$ ............................................. H01G 4/228
(52) U.S. Cl. .................. 361/306.3; 361/306.1; 361/321; 361/321.4; 361/311; 361/328
(58) Field of Search .................... 361/306.3, 321.1, 361/321.4, 320, 311, 313, 328, 329, 330, 306.1; 438/239, 253, 256, 386

(56) References Cited

U.S. PATENT DOCUMENTS

| | | | | |
|---|---|---|---|---|
| 5,206,788 A | * | 4/1993 | Larson et al. | 361/313 |
| 5,248,564 A | | 9/1993 | Ramesh | 428/688 |
| 5,426,075 A | * | 6/1995 | Perino et al. | 438/3 |
| 5,879,956 A | | 3/1999 | Seon et al. | 438/3 |
| 5,994,276 A | | 11/1999 | Hughes et al. | 505/238 |
| 6,096,343 A | | 8/2000 | Gergely et al. | 424/499 |
| 6,096,434 A | | 8/2000 | Yano et al. | 428/446 |
| 6,194,227 B1 | * | 2/2001 | Hase | 438/3 |
| 6,194,753 B1 | | 2/2001 | Seon et al. | 257/295 |
| 6,287,969 B1 | | 9/2001 | Hughes et al. | 438/687 |
| 6,303,231 B1 | * | 10/2001 | Sawada et al. | 428/470 |
| 6,387,712 B1 | | 5/2002 | Yano et al. | 438/3 |
| 2003/0119212 A1 | * | 6/2003 | Nishihara et al. | 438/3 |
| 2003/0136998 A1 | | 7/2003 | Baniecki et al. | 257/310 |
| 2004/0029399 A1 | * | 2/2004 | Honma et al. | 438/778 |

FOREIGN PATENT DOCUMENTS

JP    2001-015382    1/2001

OTHER PUBLICATIONS

T. Takenaka "Study on the paticle orientation of bismuth layer structured ferroelectric ceramics and their application to piezoelectric or pyroelectric materials," *Engineering Doctoral These at the University of Kyoto*, Dec. 1984, pp. 1–170.

* cited by examiner

*Primary Examiner*—Dean A. Reichard
*Assistant Examiner*—Nguyen T. Ha
(74) *Attorney, Agent, or Firm*—Seed IP Law Group PLLC

(57) ABSTRACT

A multi-layered unit according to the present invention includes a support substrate formed of a silicon single crystal, a barrier layer formed on the support substrate of silicon oxide, an electrode layer formed on the barrier layer of platinum, a buffer layer formed on the electrode layer of a dielectric material containing a bismuth layer structured compound having a composition represented by $Bi_4Ti_3O_{12}$, having an excellent orientation characteristic and oriented in the c axis direction, and a dielectric layer formed on the buffer layer of a dielectric material containing a bismuth layer structured compound having a composition represented by $Bi_4Ti_3O_{12}$, having an excellent capacitor characteristic and oriented in the c axis direction. Since the thus constituted multi-layered unit includes a dielectric layer containing a bismuth layer structured compound oriented in the c axis direction, in the case of, for example, providing an upper electrode on the dielectric layer, thereby fabricating a thin film capacitor and applying a voltage between the electrode layer and the upper electrode, the direction of the electric field substantially coincides with the c axis of the bismuth layer structured compound contained in the dielectric layer. As a result, since the ferroelectric property of the bismuth layer structured compound contained in the dielectric layer can be suppressed and the paraelectric property thereof can be fully exhibited, it is possible to fabricate a semiconductor device by incorporating a thin film capacitor having a small size, large capacitance and an excellent dielectric characteristic into the support substrate of a silicon single crystal together with other devices such as a field effect transistor, a CPU and the like.

56 Claims, 2 Drawing Sheets

MULTI-LAYERED UNIT INCLUDING ELECTRODE AND DIELECTRIC LAYER

BACKGROUND OF THE INVENTION

The present invention relates to a multi-layered unit including an electrode and a dielectric layer and, particularly, to a multi-layered unit including an electrode and a dielectric layer which constitute a compact thin film capacitor that is suitable for incorporation into a semiconductor wafer together with other devices such as a field effect transistor (FET), a CPU-(central processing unit) and the like, and has a large capacity and an excellent dielectric characteristic.

DESCRIPTION OF THE PRIOR ART

There is known a semiconductor device fabricated by incorporating a capacitor into a semiconductor wafer together with other devices such as a field effect transistor (FET) and a CPU (central processing unit).

In such a semiconductor device, since it is preferable for fabricating a semiconductor device of excellent quality to form the capacitor together with the other devices using a semiconductor process, a capacitor of a silicon system material capable of being formed by a semiconductor process is normally formed in the semiconductor device.

However, since a silicon system material suitable for fabricating a capacitor using a semiconductor process has a low dielectric constant, in the case of fabricating a capacitor having large capacity, the area of the capacitor inevitably becomes large and, therefore, the semiconductor device must be large, It might be thought that this problem can be solved by incorporating a thin film capacitor having a small size and large capacity into a semiconductor wafer, thereby fabricating a semiconductor device.

Japanese Patent Application Laid Open No. 2001-15382 discloses a thin film capacitor having a small size and large capacity which uses PZT, PLZT, (Ba, Sr) $TiO_3$ (BST), $Ta_2O_5$ or the like as a dielectric material, However, the dielectric constant of a dielectric thin film formed of any one of the above mentioned materials decreases as the thickness thereof decreases and the capacitance thereof greatly decreases when an electric field of 100 kV/cm, for example, is applied thereto. Therefore, in the case where any one of the above-mentioned materials is used as a dielectric material for a thin film capacitor, it is difficult to obtain a thin film capacitor having a small size and large capacity. Moreover, since the surface roughness of a dielectric thin film formed of any one of the above mentioned materials is high, its insulation performance tends to be lowered when formed thin.

It might be thought possible to overcome these problems by using a bismuth layer structured compound as a dielectric material for a thin film capacitor. The bismuth layer structured compound is discussed by Tadashi Takenaka in "Study on the particle orientation of bismuth layer structured ferroelectric ceramics and their application to piezoelectric or pyroelectric materials," Engineering Doctoral Thesis at the University of Kyoto (1984), Chapter 3, pages 23 to 36.

The bismuth layer structured compound has an anisotropic crystal structure and basically behaves as a ferroelectric material. However, it is known that the bismuth layer structured compound exhibits only weak property as a ferroelectric material and behaves like as a paraelectric material along a certain axis of orientation.

In the case of utilizing the bismuth layer structured compound as a dielectric material for a thin film capacitor, since the property thereof as a ferroelectric material causes variation in the dielectric constant, this property of the bismuth layer structured compound is undesirable and it is preferable for the bismuth layer structured compound to sufficiently exhibit a property as a paraelectric material.

Therefore, a need has been felt for the development of a thin film capacitor that has a large capacity and an excellent dielectric property, including a dielectric layer in which a bismuth layer structured compound is oriented in a direction along which the bismuth layer structured compound exhibits only weak property as a ferroelectric material and behaves like a paraelectric material, and that is suitable for incorporation into a semiconductor wafer together with other devices such as a field effect transistor (FET) and a CPU (central processing unit).

SUMMARY OF THE INVENTION

It is therefore an object of the present invention to provide a multi-layered unit including an electrode and a dielectric layer which constitute a compact thin film capacitor that is suitable for incorporation into a semiconductor wafer together with other devices such as a field effect transistor (FET), a CPU (central processing unit) and the like, and has a large capacity and an excellent dielectric characteristic.

The above and other objects of the present invention can be accomplished by a multi-layered unit constituted by forming on a semiconductor wafer, a barrier layer, an electrode layer formed of a conductive material, a buffer layer containing a bismuth layer structured compound oriented in the [001] direction and a dielectric layer of a dielectric material containing a bismuth layer structured compound epitaxially grown and oriented in the [001] direction in this order, a bismuth layer structured compound having an excellent orientation characteristic being selected as the bismuth layer structured compound contained in the buffer layer and a bismuth layer structured compound having an excellent characteristic as a capacitor material being selected as the bismuth layer structured compound contained in the dielectric layer, thereby forming an interface between the buffer layer and the dielectric layer.

In the present invention, the [001] direction as termed herein means the [001] direction of a cubic crystal, a tetragonal crystal, a monoclinic crystal or an orthorhombic crystal.

According to the present invention, since the barrier layer is formed on the semiconductor wafer, it is possible to prevent constituents of the semiconductor wafer from being melted into the electrode layer to damage it and to simultaneously prevent constituents of the electrode layer from diffusing into the semiconductor wafer to damage it.

Further, according to the present invention, since a buffer layer containing a bismuth layer structured compound having an excellent orientation characteristic and oriented in the [001] direction is formed on the electrode layer, it is possible to form the dielectric layer of a dielectric material containing a bismuth layer structured compound oriented in the [001] direction in a desired manner by epitaxially growing the dielectric material containing a bismuth layer structured compound having an excellent characteristic as a capacitor material.

Therefore, according to the present invention, since the c axis of the bismuth layer structured compound having an excellent capacitor characteristic and contained in the dielectric layer can be oriented so as to be perpendicular to the electrode layer, in the case of, for example, providing, an upper electrode on the dielectric layer and applying a voltage between the electrode layer and the upper electrode, the direction of the electric field substantially coincides with the c axis of the bismuth layer structured compound contained in the dielectric layer. Accordingly, since the ferroelectric property of the bismuth layer structured compound can be suppressed and the paraelectric property thereof can be fully exhibited, it is possible to incorporate a thin film capacitor having a small size and large capacitance into a semiconductor wafer together with other devices.

Furthermore, since the dielectric layer of the dielectric material containing the bismuth layer structured compound whose c axis orientation is improved has a high insulating property, it is possible to form the dielectric layer thinner. Therefore, it is possible to make a thin film capacitor much smaller and make a semiconductor device into which a thin film capacitor is incorporated much smaller.

Moreover, according to the present invention, in the case of mounting other semiconductor devices such as a CPU (central processing unit) on a thin film capacitor fabricated by forming an upper electrode on the dielectric layer, since other semiconductor devices are normally formed on a semiconductor wafer, the coefficient of thermal expansion of the thin film capacitor coincides with those of the semiconductor devices mounted thereon because the semiconductor wafers of the other semiconductor devices and the semiconductor wafer of the thin film capacitor are made of the same material and, therefore, it is possible to prevent connections between the thin film capacitor and the other devices from being broken due to the difference in coefficient of thermal expansion between the devices mounted on the semiconductor wafers.

In the present invention, the dielectric material containing the bismuth layer structured compound may contain unavoidable impurities.

In a preferred aspect of the present invention, the bismuth layer structured compound contained in the buffer layer and the bismuth layer structured compound contained in the dielectric layer have different compositions from each other, thereby forming an interface between the buffer layer and the dielectric layer.

In another preferred aspect of the present invention, the buffer layer and the dielectric layer are formed using different thin film forming processes, thereby forming an interface between the buffer layer and the dielectric layer. In this case, the bismuth layer structured compound contained in the buffer layer and the bismuth layer structured compound contained in the dielectric layer may have the same composition as each other.

In the present invention, the material for forming the semiconductor wafer is not particularly limited insofar as it can be used for fabricating a semiconductor device into which various devices are to be incorporated, and a silicon single crystal, gallium arsenide crystal and the like can be used for forming the semiconductor wafer.

In the present invention, the multi-layered unit includes a barrier layer on the semiconductor wafer. The barrier layer serves to prevent components of the semiconductor wafer from being melted into an electrode layer to be formed on the barrier layer to damage it.

In the present invention, the material for forming the barrier layer is not particularly limited insofar as it can prevent the electrode layer from being affected by the semiconductor wafer. In the case where a silicon single crystal is used as a semiconductor wafer, silicon oxide is preferably selected for forming the barrier layer from the viewpoint of cost, and in the case where a gallium arsenide crystal is used as the semiconductor wafer, aluminum oxide ($Al_2O_3$) or magnesium oxide (MgO) is preferably selected from the viewpoint of stability.

The barrier layer is formed to have a thickness so that a metal layer to be formed thereon cannot be affected by the semiconductor wafer.

In the present invention, the multi-layered unit includes an electrode layer formed of a conductive material on the barrier layer.

In the present invention, the material for forming the electrode layer is not particularly limited and can be a metal such as platinum (Pt), ruthenium (Ru), rhodium (Rh), palladium (Pd), iridium (Ir), gold (Au), silver (Ag), copper (Cu), nickel (Ni) or the like, an alloy containing at least one of these metal as a principal component, a conductive oxide such as NdO, NbO, $RhO_2$, $OsO_2$, $IrO_2$, $RuO_2$, $SrMoO_3$, $SrRuO_3$, $CaRuO_3$, $SrVO_3$, $SrCrO_3$, $SrCoO_3$, $LaNiO_3$, Nb doped $SrTiO_3$ or the like, a mixture of these, or a superconductor having a superconductive bismuth layer structure such as $Bi_2Sr_2CuO_6$.

In the present invention, the electrode layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like.

In the present invention, the multi-layered unit includes a buffer layer formed on the electrode layer and containing a bismuth layer structured compound oriented in the [001] direction, namely, the c axis direction. The buffer layer serves to ensure that a dielectric material containing a bismuth layer structured compound having an excellent characteristic as a capacitor material can be epitaxially grown thereon to form a dielectric layer of the dielectric material containing the bismuth layer structured compound oriented in the [001] direction, namely, the c axis direction.

Therefore, as the bismuth layer structured compound having an excellent orientation characteristic used to form the buffer layer is selected a bismuth layer structured compound different from the bismuth layer structured compound for forming the dielectric layer.

The bismuth layer structured compound has a composition represented by the stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W). In the case where the symbol A and/or B includes two or more elements, the ratio of the elements can be arbitrarily determined.

As shown in FIG. 1, the bismuth layer structured compound has a layered structure formed by alternately laminating perovskite layers 1 each including perovskite lattices 1a made of (m−1) $ABO_3$ and $(Bi_2O_2)^{2+}$ layers 2.

The number of laminates each consisting of the perovskite layer 1 and the $(Bi_2O_2)^{2+}$ layer 2 is not particularly limited and it is sufficient for the bismuth layer structured compound to include at least one pair of $(Bi_2O_2)^{2+}$ layers 2 and one perovskite layer 1 sandwiched therebetween.

The c axis of the bismuth layer structured compound means the direction obtained by connecting the pair of $(Bi_2O_2)^{2+}$ layers 2, namely, the [001] direction.

Among the bismuth layer structured compounds represented by the above stoichiometric compositional formula, a bismuth layer structured compound having an excellent orientation characteristic is used for forming the buffer layer and in the case where a bismuth layer structured compound in which the symbol m is equal to 4 in the general stoichiometric compositional formula thereof, namely, that is represented by the stoichiometric compositional formula: $(Bi_2O_2)^{2+} (A_3B_4O_{13})^{2-}$ or $Bi_2A_3 B_4O_{15}$, is used as the bismuth layer structured compound for forming the dielectric layer, the bismuth layer structured compound in which the symbol m is equal to 3 in the general stoichiometric compositional formula thereof, namely, that represented by the stoichiometric compositional formula: $(Bi_2O_2)^{2+} (A_2B_3O_{10})^{2-}$ or $Bi_2A_2 B_3O_{12}$, is preferably used for forming the buffer layer.

In the present invention, it is not absolutely necessary for the degree F of orientation in the [001] direction, namely, c axis orientation of a bismuth layer structured compound contained in a buffer layer to be 100% but it is sufficient for the degree F of c axis orientation of the bismuth layer structured compound to be equal to or more than 80%. It is more preferable for the degree of c axis orientation of the bismuth layer structured compound to be equal to or more than 90% and it is much more preferable for the degree of c axis orientation of the bismuth layer structured compound to be equal to or more than 95%.

The degree F of the c axis orientation of the bismuth layer structured compound is defined by the following formula (1).

$$F=(P-P_0)/(1-P_0)\times 100 \ldots \quad (1)$$

In formula (1), $P_0$ is defined as the X-ray diffraction intensity of polycrystal whose orientation is completely random in the c axis direction, namely, the ratio of the sum $\Sigma I_0(001)$ of reflection intensities $I_0(001)$ from the surface of [001] of polycrystal whose orientation is completely random to the sum $\Sigma I_0$ (hkl) of reflection intensities $I_0$(hkl) from the respective crystal surfaces of [hkl] thereof ($\Sigma I_0(001)/\Sigma I_0$(hkl)), and P is defined as X-ray diffraction intensity of the bismuth layer structured compound in the c axis direction, namely, the ratio of the sum $\Sigma I(001)$ of reflection intensities I (001) from the surface of [001] of the bismuth layer structured compound to the sum $\Sigma I$(hkl) of reflection intensities I(hkl) from the respective crystal surfaces of [hkl] thereof ($\Sigma I(001)/\Sigma I$(hkl)). The symbols h, k and l can each assume an arbitrary integer value equal to or larger than 0.

In the above formula (1), since $P_0$ is a known constant, when the sum $\Sigma I(001)$ of reflection intensities I(001) from the surface of [001] of the bismuth layer structured compound and the sum $\Sigma I$(hkl) of reflection intensities I(hkl) from the respective crystal surfaces of [hkl] are equal to each other, the degree F of the c axis orientation of the bismuth layer structured compound is equal to 100%.

In the present invention, the buffer layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Particularly, in the case where the buffer layer has to be formed at a low temperature, a plasma CVD process, a photo-CVD process, a laser CVD process, a photo-CSD process, a laser CSD process or the like is preferably used for forming the buffer layer.

In the present invention, the multi-layered unit includes a dielectric layer formed on the buffer layer and made of a dielectric material containing a bismuth layer structured compound formed by epitaxial growth and oriented in the [001] direction, namely, the c axis direction.

In the present invention, the dielectric layer is formed by epitaxially growing a dielectric material containing a bismuth layer structured compound on the buffer layer.

Since the dielectric layer is formed by epitaxially growing a dielectric material containing a bismuth layer structured compound formed on the buffer layer, it is possible to reliably orient the bismuth layer structured compound contained in the dielectric layer in the [001] direction, namely, the c axis direction. Therefore, in the case where a thin film capacitor is fabricated using the multi-layered unit according to the present invention, since the bismuth layer structured compound does not function as a ferroelectric material but functions as a paraelectric material, it is possible to fabricate a thin film capacitor having a small size, large capacitance and an excellent dielectric characteristic using the multi-layered unit according to the present invention.

In the present invention, it is not absolutely necessary for the degree F of orientation in the [001] direction, namely, c axis orientation of the bismuth layer structured compound to be 100% and it is sufficient for the degree F of c axis orientation to be equal to or more than 80%. It is more preferable for the degree of c axis orientation of the bismuth layer structured compound to be equal to or more than 90% and it is much more preferable for the degree of c axis orientation of the bismuth layer structured compound to be equal to or more than 95%.

The degree F of the bismuth layer structured compound is defined by the formula (1).

The dielectric characteristic of a dielectric layer can be markedly improved by orienting the bismuth layer structured compound in the [001] direction, namely, the c axis direction in this manner.

More specifically, in the case where a thin film capacitor is fabricated by forming, for example, an upper electrode on the dielectric layer of the multi-layered unit according to the present invention, even if the thickness of the dielectric layer is equal to or thinner than, for example, 100 nm, a thin film capacitor having a relatively high dielectric constant and low loss (tan δ) can be obtained. Further, a thin film capacitor having an excellent leak characteristic, an improved breakdown voltage, an excellent temperature coefficient of the dielectric constant and an excellent surface smoothness can be obtained.

In the present invention, from among the above mentioned bismuth layer structured compounds, a bismuth layer structured compound having an excellent characteristic as a capacitor material and different from that contained in the buffer layer is selected as the bismuth layer structured compound for forming the dielectric layer.

When a bismuth layer structured compound in which the symbol m is equal to 3 in the general stoichiometric compositional formula thereof, namely, that represented by the stoichiometric compositional formula: $(Bi_2O_2)^{2+} (A_2B_3O_{10})^{2-}$ or $Bi_2A_2 B_3O_{12}$, is used for forming the buffer layer, a bismuth layer structured compound in which the symbol m is equal to 4 in the general stoichiometric compositional formula thereof, namely, that represented by the stoichiometric compositional formula: $(Bi_2O_2)^{2+}$ $(A_3B_4O_{13})^{2-}$ or $Bi_2A_3$ $B_4O_{15}$, is preferably used as a bismuth layer structured compound for forming the dielectric layer.

In the present invention, it is particularly preferable that the bismuth layer structured compound contained in the dielectric layer has a composition represented by the stoichiometric compositional formula: $Ca_xSr_{(1-x)}Bi_4Ti_4O_{15}$, where x is equal to or larger than 0 and equal to or smaller than 1. If the bismuth layer structured compound having such a composition is used, a dielectric layer having a relatively large dielectric constant can be obtained and the temperature characteristic thereof can be further improved.

In the present invention, parts of the elements represented by the symbols A or B in the stoichiometric compositional formula of the bismuth layer structured compound contained in the dielectric layer are preferably replaced with at least one element Re (yttrium (Y) or a rare-earth element) selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

The preferable amount of replacement by the element Re depends upon the value of the symbol m. For example, in the case where the symbol m is equal to 3, in the compositional formula: $Bi_2A_{(2-x)}Re_xB_3O_{12}$, x is preferably equal to or larger than 0.4 and equal to or smaller than 1.8 and more preferably equal to or larger than 1.0 and equal to or smaller than 1.4. If the amount of replacement by the element Re is determined within this range, the Curie temperature (phase transition temperature from ferroelectric to paraelectric) of the dielectric layer can be controlled preferably to be equal to or higher than $-100°$ C. and equal to or lower than $100°$ C. and more preferably to be equal to or higher than $-50°$ C. and equal to or lower than $50°$ C. If the Curie point is equal to or higher than $-100°$ C. and equal to or lower than $100°$ C., the dielectric constant of the dielectric thin film 6 increases. The Curie temperature can be measured by DSC (differential scanning calorimetry) or the like. If the Curie point becomes lower than room temperature ($25°$ C.), tan $\delta$ further decreases and, as a result, the loss value Q further increases.

Furthermore, in the case where the symbol m is equal to 4, in the compositional formula: $Bi_2A_{(3-x)}Re_xB_4O_{15}$, x is preferably equal to or larger than 0.01 and equal to or smaller than 2.0 and more preferably equal to or larger than 0.1 and equal to or smaller than 1.0.

Although the dielectric layer of the multi-layered unit according to the present invention has an excellent leak characteristic even if it does not contain the element Re, it is possible to further improve the leak characteristic by replacing part of the elements represented by the symbols A or B with the element Re.

For example, even in the case where no part of the elements represented by the symbols A or B in the stoichiometric compositional formula of the bismuth layer structured compound is replaced with element Re, the leak current measured at the electric filed strength of 50 kV/cm can be controlled preferably to be equal to or lower than $1 \times 10^{-7}$ $A/cm^2$ and more preferably to be equal to or lower than $5 \times 10^{-8}$ $A/cm^2$ and the short circuit ratio can be controlled preferably to be equal to or lower than 10% and more preferably to be equal to or lower than 5%. However, in the case where parts of the elements represented by the symbols A or B in the stoichiometric compositional formula of the bismuth layer structured compound are replaced with element Re, the leak current measured under the same condition can be controlled preferably to be equal to or lower than $5 \times 10^{-8}$ $A/cm^2$ and more preferably to be equal to or lower than $1 \times 10^{-8}$ $A/cm^2$ and the short circuit ratio can be controlled preferably to be equal to or lower than 5% and more preferably to be equal to or lower than 3%.

In the present invention, the dielectric layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Particularly, in the case where the dielectric layer has to be formed at a low temperature, a plasma CVD process, a photo-CVD process, a laser CVD process, a photo-CSD process, a laser CSD process or the like is preferably used for forming the dielectric layer.

The multi-layered unit including an electrode layer and a dielectric layer according to the present invention can be used not only as a component of a thin film capacitor but also as a unit for causing an inorganic EL device to emit light. Specifically, an insulating layer is necessary between an electrode layer and an inorganic EL device in order to cause the inorganic EL device to emit light. Since a dielectric layer of a dielectric material containing a bismuth layer structured compound having an improved c axis orientation has a high insulating property, it is possible to cause an inorganic EL device to emit light in a desired manner by disposing the inorganic EL device on the dielectric layer, disposing another electrode on the inorganic EL device and applying a voltage between the electrode layer and the other electrode.

The above and other objects and features of the present invention will become apparent from the following description made with reference to the accompanying drawings.

DESCRIPTION OF THE PREFERRED EMBODIMENTS

Figure 1:
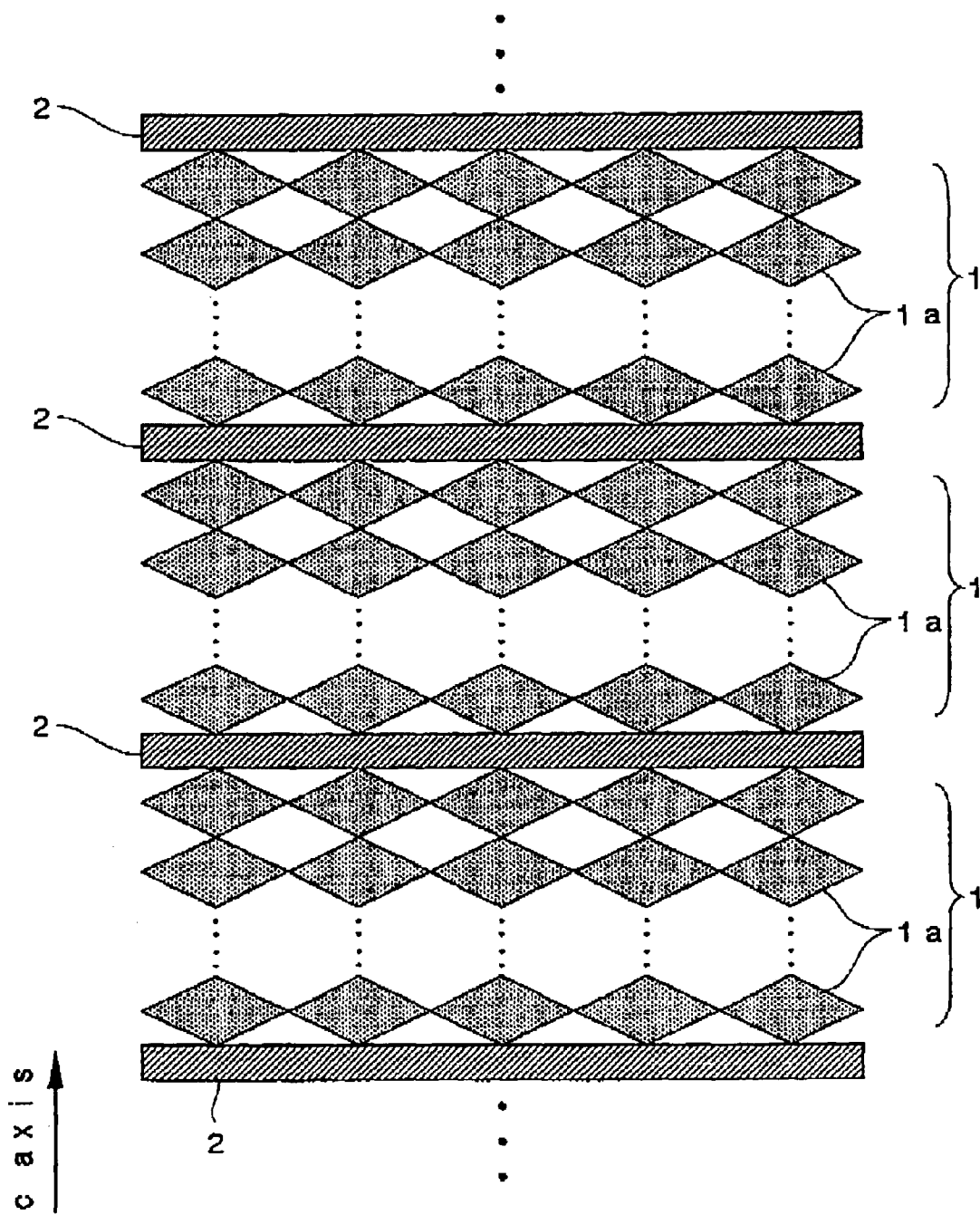
FIG. 1 is a drawing schematically showing the structure of a bismuth layer structured compound.
Figure 2:
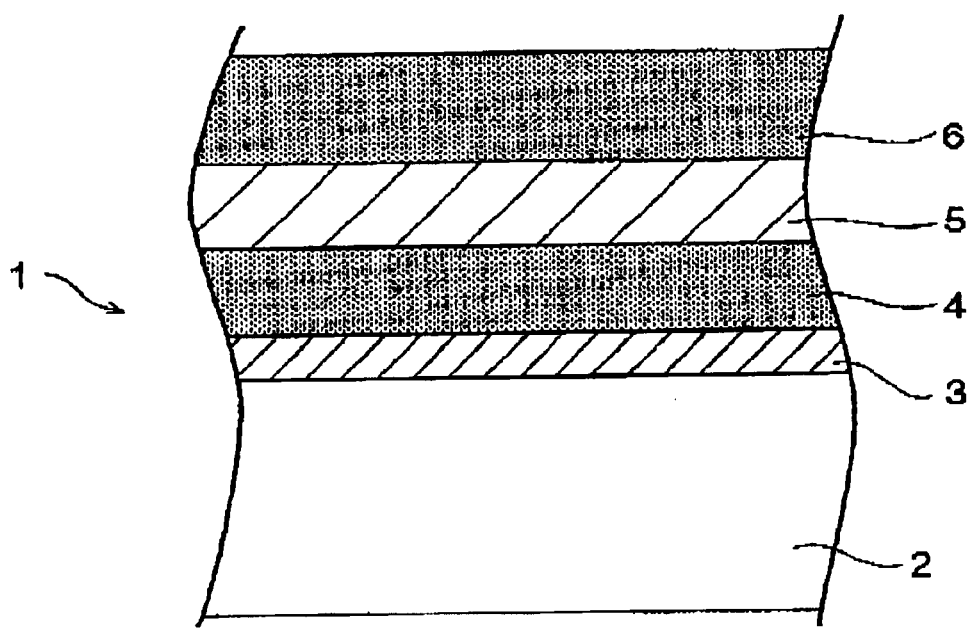
FIG. 2 is a schematic partial cross-sectional view showing a multi-layered unit which is a preferred embodiment of the present invention.

FIG. 2 is a schematic partial cross-sectional view showing a multi-layered unit which is a preferred embodiment of the present invention.

As shown in FIG. 2, a multi-layered unit 1 according to this embodiment is constituted by laminating a barrier layer 3, an electrode layer 4, a buffer layer 5 and a dielectric layer 6 on a support substrate 2 in this order.

In this embodiment, the support substrate 2 of the multi-layered unit 1 is formed of a silicon single crystal.

The multi-layered unit 1 according to this embodiment includes a barrier layer 3 formed of silicon oxide on the support substrate 2.

The barrier layer 3 of silicon oxide is formed by, for example, thermal oxidation of silicon.

As shown in FIG. 2, an electrode layer 4 is formed on the barrier layer 3 and in this embodiment, the electrode layer 4 is formed of platinum oriented in the [001] direction.

In the case where an electrode layer 4 of platinum is directly formed on the support substrate 2 formed on a silicon single crystal, silicon melts into the platinum to damage the electrode layer 4 and when the multi-layered unit 1 according to this embodiment is used as a component of a thin film capacitor, the performance of the thin film capacitor may become worse. However, in this embodiment, since the electrode layer 4 is formed on the barrier layer 3 formed of silicon oxide, when the multi-layered unit 1 according to this embodiment is used as a component of a thin film capacitor, it is possible to reliably prevent the performance of the thin film capacitor from being lowered.

An electrode layer 4 of platinum is formed on the buffer layer 4 so as to have a thickness of 100 nm, for example, by using argon gas having a pressure of 1 pascal (Pa) as a sputtering gas, setting the temperature of the buffer layer 4 to 400° C. and setting the electric power to 100 W.

Since platinum has a cubic crystal structure, when an electrode layer 4 of platinum is formed on the barrier layer 3 of silicon oxide, the platinum is oriented in the most stable [111] direction.

As shown in FIG. 2, the multi-layered unit 1 according to this embodiment includes a buffer layer 5 formed on the electrode layer 4 and formed of a dielectric material containing a bismuth layer structured compound having a composition represented by $Bi_4Ti_3O_{12}$.

In this embodiment, the buffer layer 5 of the dielectric material containing a bismuth layer structured compound having a composition represented by $Bi_4Ti_3O_{12}$ is formed by a metal organic chemical vapor deposition process (MOCVD), for example.

In the case where a buffer layer 5 of the dielectric material containing a bismuth layer structured compound having a composition represented by $Bi_4Ti_3O_{12}$ is formed by a metal organic chemical vapor deposition process (MOCVD), for example, $Bi(CH_3)_3$ and $Ti(O-i-C_3H_7)_4$ are used as constituent gases and the temperature of the barrier layer 3 of silicon oxide is maintained at 550° C., thereby forming a buffer layer 5 having a thickness of 50 nm and oriented in the [001] direction, namely, the c axis direction.

In this embodiment, the buffer layer 5 serves to ensure that a dielectric layer 5 of a dielectric material containing a bismuth layer structured compound oriented in the [001] direction, namely, the c axis direction, can be formed by epitaxially growing a dielectric material containing a bismuth layer structured compound thereon.

As shown in FIG. 2, the multi-layered unit 1 according to this embodiment includes a dielectric layer 6 formed on the buffer layer 5.

In this embodiment, the dielectric layer 6 is formed of a dielectric material containing a bismuth layer structured compound represented by the stoichiometric compositional formula: $SrBi_4Ti_4O_{15}$ and having an excellent capacitor characteristic.

In this embodiment, the dielectric layer 6 is formed on the buffer layer 5 using a metal organic deposition (MOD) process.

Concretely, a toluene solution of 2-ethyl hexanoate Sr, a 2-ethyl hexanoate solution of 2-ethyl hexanoate Bi and a toluene solution of 2-ethyl hexanoate Ti are stoichiometrically mixed so that the mixture contains 1 mole of 2-ethyl hexanoate Sr, 4 moles of 2-ethyl hexanoate Bi and 4 moles of 2-ethyl hexanoate Ti and is diluted with toluene. The resultant constituent solution is coated on the buffer layer 5 using a spin coating method and after drying the resultant dielectric layer 6 is tentatively baked at a temperature under which the dielectric layer 6 cannot be crystallized.

The same constituent solution is coated on the thus tentatively baked dielectric layer 6 using a spin coating method to form a coating layer and the coating layer is dried and tentatively baked. These operations are repeated.

When tentative baking is completed, the dielectric layer 6 is baked and a series of operations including coating, drying, tentative baking, coating, drying, tentative baking and baking are repeated until a dielectric layer 6 having a required thickness, for example, 100 nm is obtained. During these processes, a dielectric material containing a bismuth layer structured compound is epitaxially grown and a dielectric layer 6 oriented in the [001] direction, namely, the c axis direction is formed.

According to this embodiment, since the multi-layered unit 1 has such a structure that the barrier layer 3, the electrode layer 4, the buffer layer 5, and the dielectric layer 6 are laminated on the support substrate 2 of a silicon single crystal, it is possible to easily incorporate a thin film capacitor into the support substrate 2 of a silicon single crystal together with other devices such as a field effect transistor, a CPU and the like by, for example, providing an upper electrode on the dielectric layer 6, and fabricate a semiconductor device.

Further, according to this embodiment, since the barrier layer 3 is formed of silicon oxide on the support substrate of a silicon single crystal, it is possible to reliably prevent silicon from being melted into an electrode layer 4 to damage it and, therefore, when a thin film capacitor is fabricated using the multi-layered unit 1 according to this embodiment as a component, it is possible to reliably prevent the performance of the thin film capacitor from being lowered.

Furthermore, according to this embodiment, the buffer layer 5 of a dielectric material containing a bismuth layer structured compound having a composition represented by $Bi_4Ti_3O_{12}$ and having an excellent orientation characteristic is formed on the electrode layer 4 so that the bismuth layer structured compound is oriented in the [001] direction, namely, the c axis direction, and the dielectric layer 6 is formed by epitaxially growing a dielectric material containing a bismuth layer structured compound having a composition represented by $SrBi_4Ti_4O_{15}$ and having an excellent capacitor characteristic on the buffer layer 5. Therefore, it is possible to reliably orient the bismuth layer structured compound contained in the dielectric layer 6 in the [001] direction, namely, the c axis direction.

Therefore, according to this embodiment, since the multi-layered unit 1 includes a dielectric layer 6 formed of a dielectric material containing a bismuth layer structured compound oriented in the [001] direction, namely, the c axis direction, in the case of, for example, providing an upper electrode on the dielectric layer 6 of the multi-layered unit 1 according to this embodiment, thereby fabricating a thin film capacitor and applying a voltage between the electrode layer 4 and the upper electrode, the direction of the electric field substantially coincides with the c axis of the bismuth layer structured compound contained in the dielectric layer 6. As a result, since the ferroelectric property of the bismuth layer structured compound contained in the dielectric layer 6 can be suppressed and the paraelectric property thereof can be fully exhibited, it is possible to fabricate an integrated device with a semiconductor by incorporating a thin film capacitor having a small size, large capacitance and an excellent dielectric performance into the support substrate 2 of a silicon single crystal together with other devices such as a field effect transistor, a CPU and the like.

Further, according to this embodiment, since the multi-layered unit 1 includes a dielectric layer 6 formed of a dielectric material containing a bismuth layer structured compound oriented in the [001] direction, namely, the c axis direction, and the dielectric layer 6 containing the bismuth layer structured compound whose c axis orientation is improved has a high insulating property, the dielectric layer 6 can be made thinner. As a result, it is possible to make a thin film capacitor much thinner and make a semiconductor device into which the thin film capacitor is incorporated much smaller.

Furthermore, according to this embodiment, the buffer layer 5 having a thickness of 50 nm is formed using a metal organic chemical vapor deposition (MOCVD) process so as to enable epitaxial growth of a bismuth layer structured compound having an excellent capacitor characteristic thereon and form a dielectric layer 6 containing the bismuth layer structured compound reliably oriented in the [001] direction, namely, the c axis direction and, on the other hand, the dielectric layer 6 on which no layer is formed using an epitaxial growth process and which has a thickness larger than that of the buffer layer 5 is formed using a metal organic decomposition (MOD) process, which is an inexpensive process. Therefore, it is possible to decrease the cost of fabricating a multi-layered unit 1.

The present invention has thus been shown and described with reference to specific embodiments. However, it should be noted that the present invention is in no way limited to the details of the described arrangements but changes and modifications may be made without departing from the scope of the appended claims.

For example, in the above described embodiment, although the multi-layered unit 1 is fabricated by laminating the barrier layer 3, the electrode layer 4, the buffer layer 5 and the dielectric layer 6 on the support substrate 2, the multi-layer unit 1 may be formed by further laminating a plurality of unit multi-layered elements each including an electrode layer 4, a buffer layer 5 and a dielectric layer 6 on the dielectric layer 6 and a thin film capacitor may be fabricated by forming an upper electrode on the dielectric layer 6 of the uppermost unit multi-layered element. However, in the case where the multi-layered unit 1 is constituted by further laminating a plurality of unit multi-layered elements on the dielectric layer 6, if an electrode layer included in each of the unit multi-layered elements is formed by epitaxially growing crystals of a conductive material on a dielectric layer 6, the electrode layer can be oriented in the [001] direction. Therefore, since it is possible to epitaxially grow a dielectric material containing a bismuth layer structured compound and form a dielectric layer 6 of the dielectric material containing the bismuth layer structured compound oriented in the [001] direction, it is unnecessary for each of the unit multi-layered elements to include a buffer layer 5 and each of the unit multi-layered elements can be constituted by an electrode layer and a dielectric layer 6. It is further possible to laminate one or more unit multi-layered elements each including an electrode layer and a dielectric layer 6 and one or more unit multi-layered elements each including an electrode layer, a buffer layer formed on the electrode layer and a dielectric layer formed of a dielectric material containing a bismuth layer structured compound on the buffer layer on the dielectric layer 6 in an arbitrary order and form an upper electrode on the dielectric layer 6 of the uppermost unit multi-layered element, thereby fabricating a thin film capacitor.

Further, in the above described embodiment, although the support substrate 2 of the multi-layered unit 1 is formed of a silicon single crystal, it is not absolutely necessary to use a support substrate 2 formed of a silicon single crystal and the material for forming the support substrate 2 is not particularly limited insofar as it can be used for fabricating a semiconductor device into which various devices are incorporated. For example, instead of a silicon single crystal, the support substrate 2 may be formed of a gallium arsenide crystal.

Furthermore, in the above described embodiment, although the barrier layer 3 is formed of silicon oxide on the support substrate 2, it is not absolutely necessary to form the barrier layer 3 of silicon oxide and the barrier layer 3 may be formed of any material insofar as it can prevent the electrode layer 4 to be formed thereon from being affected by the support substrate 2. For example, in the case where the support substrate 2 is formed of a gallium arsenide crystal, aluminum oxide ($Al_2O_3$) or magnesium oxide (MgO) is preferably selected for forming the barrier layer 3 from the viewpoint of stability.

Moreover, in the above described embodiment, although the multi-layered unit 1 includes the electrode layer 4 of platinum formed on the barrier layer 3, it is not absolutely necessary to form the electrode layer 4 of platinum and the material for forming the electrode layer 4 is not particularly limited insofar as it is conductive. Instead of platinum (Pt), the electrode layer 4 may be formed of a metal such as ruthenium (Ru), rhodium (Rh), palladium (Pd), iridium (Ir), gold (Au), silver (Ag), copper (Cu), nickel (Ni) or the like, an alloy containing at least one of these metal as a principal component, a conductive oxide such as NdO, NbO, $RhO_2$, $OsO_2$, $IrO_2$, $RuO_2$, $SrMoO_3$, $SrRuO_3$, $CaRuO_3$, $SrVO_3$, $SrCrO_3$, $SrCoO_3$, $LaNiO_3$, Nb doped $SrTiO_3$ or the like or a mixture of these.

Further, in the above described embodiment, although the electrode layer 4 is formed using a sputtering process, it is not absolutely necessary to form the electrode layer 4 using a sputtering process and instead of a sputtering process, the electrode layer 4 may be formed using any of various thin film forming processes such as a vacuum deposition process, a pulsed laser deposition process (PLD), a metal organic chemical vapor deposition process (MOCVD), a chemical solution deposition process (CSD process) such as a metal-organic decomposition process (MOD) and a sol-gel process or the like.

Furthermore, although in the multi-layered unit 1 of the above described embodiment, the electrode layer 4 is formed thereon with the buffer layer 5 formed of a dielectric material containing a bismuth layer structured compound having a composition represented by $Bi_4Ti_3O_{12}$ wherein the symbol m is equal to 3 in the general stoichiometric compositional formula thereof and having an excellent orientation characteristic, it is not absolutely necessary to form on the electrode layer 4 the buffer layer 5 of a dielectric material containing a bismuth layer structured compound having a composition represented by $Bi_4Ti_3O_{12}$ wherein m is equal to 4 in the general stoichiometric compositional formula of a bismuth layer structured compound and having an excellent orientation characteristic, and the buffer layer 5 may be formed of a dielectric material containing a bismuth layer structured compound wherein the symbol m is not equal to 3 in the general stoichiometric compositional formula thereof insofar as it has an excellent orientation characteristic. Further, the buffer layer 5 may be formed of a dielectric material containing another bismuth layer structured compound whose constituent elements are different from $Bi_4Ti_3O_{12}$.

Moreover, in the above described embodiment, although the buffer layer 5 is formed using a metal organic chemical vapor deposition process (MOCVD), it is not absolutely necessary to form the buffer layer 5 using a metal-organic chemical vapor deposition process and the buffer layer 5 may be formed using some other thin film forming process such as a vacuum deposition process, a sputtering process, a pulsed laser deposition process (PLD), a chemical solution deposition process (CSD process) such as a metal-organic decomposition process (MOD) and a sol-gel process or the like.

Further, in the multi-layered unit 1 of the above described embodiment, the buffer layer 5 is formed thereon with the dielectric layer 6 formed of a dielectric material containing a bismuth layer structured compound having a composition represented by $SrBi_4Ti_4O_{15}$ where the symbol m is equal to 4 in the stoichiometric compositional formula thereof. However, it is not absolutely necessary to form on the buffer layer 5 the dielectric layer 6 of the dielectric material containing the bismuth layer structured compound having a composition represented by $SrBi_4Ti_4O_{15}$ where the symbol m is equal to 4 in the general stoichiometric compositional formula thereof, and the dielectric layer 6 may be formed of a dielectric material containing a bismuth layer structured compound wherein the symbol m is not equal to 4 in the general stoichiometric compositional formula thereof or a dielectric material containing another bismuth layer structured compound whose constituent elements are different from $Bi_4Ti_3O_{12}$ insofar as it has an excellent capacitor characteristic.

Furthermore, in the above described embodiment, although the dielectric layer 6 is formed using a metal-organic decomposition process (MOD), it is not absolutely necessary to form the dielectric layer 6 using a metal-organic decomposition process and the dielectric layer 6 may be formed using other thin film forming processes such as a vacuum deposition process, a sputtering process, a pulsed laser deposition process (PLD), a metal organic chemical vapor deposition process (MOCVD), other chemical solution deposition process (CSD process) such as a sol-gel process or the like.

Moreover, in the above described embodiment, the multi-layered unit 1 includes the buffer layer 5 formed on the electrode layer 4 of a dielectric material containing a bismuth layer structured compound having a composition represented by $Bi_4Ti_3O_{12}$ wherein the symbol m is equal to 4 in the general stoichiometric compositional formula thereof and having an excellent orientation characteristic and the dielectric layer 6 formed on the buffer layer 5 of a dielectric material containing a bismuth layer structured compound having a composition represented by $SrBi_4Ti_4O_{15}$ where the symbol m is equal to 4 in the general stoichiometric compositional formula thereof, and the buffer layer 5 and the dielectric layer 6 are formed of dielectric materials containing bismuth layer structured compounds having different compositions. However, if an interface is formed between the buffer layer 5 and the dielectric layer 6, the buffer layer 5 and the dielectric layer 6 may be formed using different thin film forming processes so as to contain bismuth layer structured compound having the same composition.

Moreover, in the above described embodiment, although the multi-layered unit 1 is used as a component of a thin film capacitor, the multi-layered unit 1 can be used not only as a component of a thin film capacitor but also as a multi-layered unit for causing an inorganic EL device to emit light having high luminescence. Specifically, although an insulating layer having a high insulating property is necessary between an electrode layer 4 and an inorganic EL device in order to cause the inorganic EL device to emit light having high luminescence, since a dielectric layer 6 of a dielectric material containing a bismuth layer structured compound having an improved c axis orientation has a high insulating-property, it is possible to cause an inorganic EL device to emit light in a desired manner by disposing the inorganic EL device on the dielectric layer 6, disposing another electrode on the inorganic EL device and applying a voltage between the electrode layer 4 and the other electrode.

According to the present invention, it is possible to provide a multi-layered unit including an electrode and a dielectric layer which can constitute a compact thin film capacitor which is suitable for incorporation into a semiconductor wafer together with other devices such as a field effect transistor (FET), a CPU (central processing unit) and the like and has a large capacity and an excellent dielectric characteristic.

What is claimed is:

1. A multi-layered unit constituted by forming on a semiconductor wafer, a barrier layer, an electrode layer formed of a conductive material, a buffer layer containing a bismuth layer structured compound oriented in the [001] direction and a dielectric layer of a dielectric material containing a bismuth layer structured compound epitaxially grown and oriented in the [001] direction in this order, a bismuth layer structured compound having an orientation characteristic being selected as the bismuth layer structured compound contained in the buffer layer and a bismuth layer structured compound having characteristics as a capacitor material being selected as the bismuth layer structured compound contained in the dielectric layer, thereby forming an interface between the buffer layer and the dielectric layer.

2. A multi-layered unit in accordance with claim 1, wherein the bismuth layer structured compound contained in the buffer layer and the bismuth layer structured compound contained in the dielectric layer have different compositions.

3. A multi-layered unit in accordance with claim 1, wherein the support substrate is formed of a silicon single crystal and the barrier layer is formed of silicon oxide.

4. A multi-layered unit in accordance with claim 2, wherein the support substrate is formed of a silicon single crystal and the barrier layer is formed of silicon oxide.

5. A multi-layered unit in accordance with claim 1, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

6. A multi-layered unit in accordance with claim 2, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

7. A multi-layered unit in accordance with claim 3, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

8. A multi-layered unit in accordance with claim 4, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

9. A multi-layered unit in accordance with claim 1, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}O_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

10. A multi-layered unit in accordance with claim 2, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

11. A multi-layered unit in accordance with claim 3, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

12. A multi-layered unit in accordance with claim 4, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

13. A multi-layered unit in accordance with claim 5, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

14. A multi-layered unit in accordance with claim 6, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

15. A multi-layered unit in accordance with claim 7, wherein the buffer layer contains a bismuth layer structured compound having a composition represented by a stoichiometric compositional, formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

16. A multi-layered unit in accordance with claim 8, wherein the buffer layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

17. A multi-layered unit in accordance with claim 1, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

18. A multi-layered unit in accordance with claim 2, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

19. A multi-layered unit in accordance with claim 3, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

20. A multi-layered unit in accordance with claim 4, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

21. A multi-layered unit in accordance with claim 5, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

22. A multi-layered unit in accordance with claim 6, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

23. A multi-layered unit in accordance with claim 7, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

24. A multi-layered unit in accordance with claim 8, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

25. A multi-layered unit in accordance with claim 9, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

26. A multi-layered unit in accordance with claim 10, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

27. A multi-layered unit in accordance with claim 11, wherein the dielectric layer contains a bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

28. A multi-layered unit in accordance with claim 12, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

29. A multi-layered unit in accordance with claim 13, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

30. A multi-layered unit in accordance with claim 14, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

31. A multi-layered unit in accordance with claim 15, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

32. A multi-layered unit in accordance with claim 16, wherein the dielectric layer contains a bismuth layer structured compound having a composition represented by a stoichiometric compositional formula: $(Bi_2O_2)^{2+} (A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

33. A multi-layered unit in accordance with claim 17, wherein the buffer layer contains the bismuth layer structured compound wherein the symbol m is equal to 3 and the dielectric layer contains the bismuth layer structured compound wherein the symbol m is equal to 4.

34. A multi-layered unit in accordance with claim 18, wherein the buffer layer contains the bismuth layer structured compound wherein the symbol m is equal to 3 and the dielectric layer contains the bismuth layer structured compound wherein the symbol m is equal to 4.

35. A multi-layered unit in accordance with claim 19, wherein the buffer layer contains the bismuth layer structured compound wherein the symbol m is equal to 3 and the dielectric layer contains the bismuth layer structured compound wherein the symbol m is equal to 4.

36. A multi-layered unit in accordance with claim 20, wherein the buffer layer contains the bismuth layer structured compound wherein the symbol m is equal to 3 and the dielectric layer contains the bismuth layer structured compound wherein the symbol m is equal to 4.

37. A multi-layered unit in accordance with claim 21, wherein the buffer layer contains the bismuth layer structured compound wherein the symbol m is equal to 3 and the dielectric layer contains the bismuth layer structured compound wherein the symbol m is equal to 4.

38. A multi-layered unit in accordance with claim 22, wherein the buffer layer contains the bismuth layer structured compound wherein the symbol m is equal to 3 and the dielectric layer contains the bismuth layer structured compound wherein the symbol m is equal to 4.

39. A multi-layered unit in accordance with claim 23, wherein the buffer layer contains the bismuth layer structured compound wherein the symbol m is equal to 3 and the dielectric layer contains the bismuth layer structured compound wherein the symbol m is equal to 4.

40. A multi-layered unit in accordance with claim 24, wherein the buffer layer contains the bismuth layer structured compound wherein the symbol m is equal to 3 and the dielectric layer contains the bismuth layer structured compound wherein the symbol m is equal to 4.

41. A multi-layered unit in accordance with claim 25, wherein the buffer layer contains the bismuth layer structured compound wherein the symbol m is equal to 3 and the dielectric layer contains the bismuth layer structured compound wherein the symbol m is equal to 4.

42. A multi-layered unit in accordance with claim 26, wherein the buffer layer contains the bismuth layer structured compound wherein the symbol m is equal to 3 and the dielectric layer contains the bismuth layer structured compound wherein the symbol m is equal to 4.

43. A multi-layered unit in accordance with claim 27, wherein the buffer layer contains the bismuth layer structured compound wherein the symbol m is equal to 3 and the dielectric layer contains the bismuth layer structured compound wherein the symbol m is equal to 4.

44. A multi-layered unit in accordance with claim 28, wherein the buffer layer contains the bismuth layer structured compound wherein the symbol m is equal to 3 and the dielectric layer contains the bismuth layer structured compound wherein the symbol m is equal to 4.

45. A multi-layered unit in accordance with claim 29, wherein the buffer layer contains the bismuth layer structured compound wherein the symbol m is equal to 3 and the dielectric layer contains the bismuth layer structured compound wherein the symbol m is equal to 4.

46. A multi-layered unit in accordance with claim 30, wherein the buffer layer contains the bismuth layer structured compound wherein the symbol m is equal to 3 and the dielectric layer contains the bismuth layer structured compound wherein the symbol m is equal to 4.

47. A multi-layered unit in accordance with claim 31, wherein the buffer layer contains the bismuth layer structured compound wherein the symbol m is equal to 3 and the dielectric layer contains the bismuth layer structured compound wherein the symbol m is equal to 4.

48. A multi-layered unit in accordance with claim 32, wherein the buffer layer contains the bismuth layer structured compound wherein the symbol m is equal to 3 and the dielectric layer contains the bismuth layer structured compound wherein the symbol m is equal to 4.

49. A multi-layered unit comprising:

a semiconductor wafer;

a barrier layer overlaying the semiconductor wafer;

an electrode layer composed of a conductive material overlaying the barrier layer;

a buffer layer overlaying the electrode layer, said buffer layer containing a first bismuth layer structure compound oriented in the [001] direction; and a dielectric layer formed by epitaxially growing a dielectric material containing a second bismuth layer structured compound on the buffer layer and oriented in the [001] direction, the first bismuth layer structured compound contained in the buffer layer being selected to have an orientation characteristic, the second bismuth layer structured compound contained in the dielectric layer being selected to have capacitor characteristics, and the first and second bismuth layer structured compounds forming an interface between the buffer layer and the dielectric layer.

50. A multi-layered unit in accordance with claim 49, wherein the first bismuth layer structured compound and the second bismuth layer structured compound have different compositions.

51. A multi-layered unit in accordance with claim 49, wherein the support substrate is formed of a silicon single crystal and the barrier layer is formed of silicon oxide.

52. A multi-layered unit in accordance with claim 49, wherein the electrode layer contains at least one kind of metal selected from a group consisting of platinum (Pt), ruthenium (Ru), rhodium (Rh), palladium (Pd), iridium (Ir), gold (Au), silver (Ag), copper (Cu) and nickel (Ni).

53. A multi-layered unit in accordance with claim 49, wherein the first bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

54. A multi-layered unit in accordance with claim 49, wherein the second bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

55. A multi-layered unit in accordance with claim 54, wherein the first bismuth layer structured compound having a composition represented by a stoichiometric compositional formula: $(Bi_2O_2)^{2+}$ $(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

56. A multi-layered unit in accordance with claim 55, wherein the symbol m is equal to 3 in the first bismuth layer structured compound and the symbol m is equal to 4 in the second bismuth layer structured compound.

* * * * *

UNITED STATES PATENT AND TRADEMARK OFFICE
CERTIFICATE OF CORRECTION

PATENT NO. : 6,891,714 B2
DATED : May 10, 2005
INVENTOR(S) : Yukio Sakashita

It is certified that error appears in the above-identified patent and that said Letters Patent is hereby corrected as shown below:

Column 14,
Line 66, "$Bi_2A_{m-1}O_mO_{3m+3}$" should read as -- $Bi_2A_{m-1}B_mO_{3m+3}$ --.

Signed and Sealed this

Twenty-seventh Day of September, 2005

JON W. DUDAS
*Director of the United States Patent and Trademark Office*